(12) United States Patent
Westerman et al.

(10) Patent No.: US 6,905,626 B2
(45) Date of Patent: Jun. 14, 2005

(54) NOTCH-FREE ETCHING OF HIGH ASPECT SOI STRUCTURES USING ALTERNATING DEPOSITION AND ETCHING AND PULSED PLASMA

(75) Inventors: Russell Westerman, Largo, FL (US); David Johnson, Palm Harbor, FL (US); Shouliang Lai, Tampa, FL (US)

(73) Assignee: Unaxis USA Inc., St. Petersburg, FL (US)

( * ) Notice: Subject to any disclaimer, the term of this patent is extended or adjusted under 35 U.S.C. 154(b) by 102 days.

(21) Appl. No.: 10/601,076

(22) Filed: Jun. 19, 2003

(65) Prior Publication Data

US 2004/0055995 A1 Mar. 25, 2004

Related U.S. Application Data

(60) Provisional application No. 60/398,347, filed on Jul. 24, 2002.

(51) Int. Cl.[7] ............................................. H01L 21/00
(52) U.S. Cl. .............................. 216/67; 216/37; 216/68; 216/69; 438/706; 438/710; 438/733; 438/739
(58) Field of Search ............................. 216/37, 67, 68, 216/69; 438/706, 710, 733, 739

(56) References Cited

U.S. PATENT DOCUMENTS

| 4,500,563 | A | | 2/1985 | Ellenberger et al. |
|---|---|---|---|---|
| 4,985,114 | A | | 1/1991 | Okudaira et al. |
| 5,435,886 | A | | 7/1995 | Fujiwara et al. |
| 5,468,341 | A | | 11/1995 | Samukawa |
| 5,501,893 | A | | 3/1996 | Laermer et al. |
| 5,683,538 | A | | 11/1997 | O'Neill et al. |
| 5,770,097 | A | | 6/1998 | O'Neill et al. |
| 5,983,828 | A | | 11/1999 | Savas |
| 6,051,503 | A | * | 4/2000 | Bhardwaj et al. ........... 438/705 |
| 6,071,822 | A | | 6/2000 | Donohue et al. |
| 6,129,806 | A | * | 10/2000 | Kaji et al. .............. 156/345.46 |
| 6,187,685 | B1 | | 2/2001 | Hopkins et al. |
| 6,214,162 | B1 | | 4/2001 | Koshimizu |
| 6,231,777 | B1 | | 5/2001 | Kofuji et al. |
| 6,253,704 | B1 | | 7/2001 | Savas |
| 6,255,221 | B1 | | 7/2001 | Hudson et al. |
| 6,319,355 | B1 | | 11/2001 | Holland |
| 6,332,425 | B1 | | 12/2001 | Kofuji et al. |
| 6,372,654 | B1 | | 4/2002 | Tokashiki |
| 6,395,641 | B2 | | 5/2002 | Savas |
| 6,471,821 | B2 | | 10/2002 | Ogino et al. |
| 2002/0066537 | A1 | | 6/2002 | Ogino et al. |
| 2002/0079058 | A1 | | 6/2002 | Okumura et al. |
| 2002/0114897 | A1 | | 8/2002 | Sumiya et al. |
| 2002/0115301 | A1 | | 8/2002 | Savas |
| 2002/0153101 | A1 | | 10/2002 | Nguyen et al. |

FOREIGN PATENT DOCUMENTS

| JP | 06061182 | 3/1994 |
|---|---|---|
| JP | 11026433 | 1/1999 |
| JP | 11102895 | 4/1999 |
| JP | 11219938 | 10/1999 |
| JP | 200294540 | 10/2000 |

* cited by examiner

Primary Examiner—Shamim Ahmed
(74) Attorney, Agent, or Firm—Holland & Knight LLP

(57) ABSTRACT

A method of preventing notching during a cyclical etching and deposition of a substrate with an inductively coupled plasma source is provided by the present invention. In accordance with the method, the inductively coupled plasma source is pulsed to prevent charge build up on the substrate. The off state of the inductively coupled plasma source is selected to be long enough that charge bleed off can occur, but not so long that reduced etch rates result due to a low duty cycle. The pulsing may be controlled such that it only occurs when the substrate is etched such that an insulating layer is exposed. A bias voltage may also be provided to the insulating layer and the bias voltage may be pulsed in phase or out of phase with the pulsing of the inductively coupled plasma source.

16 Claims, 2 Drawing Sheets

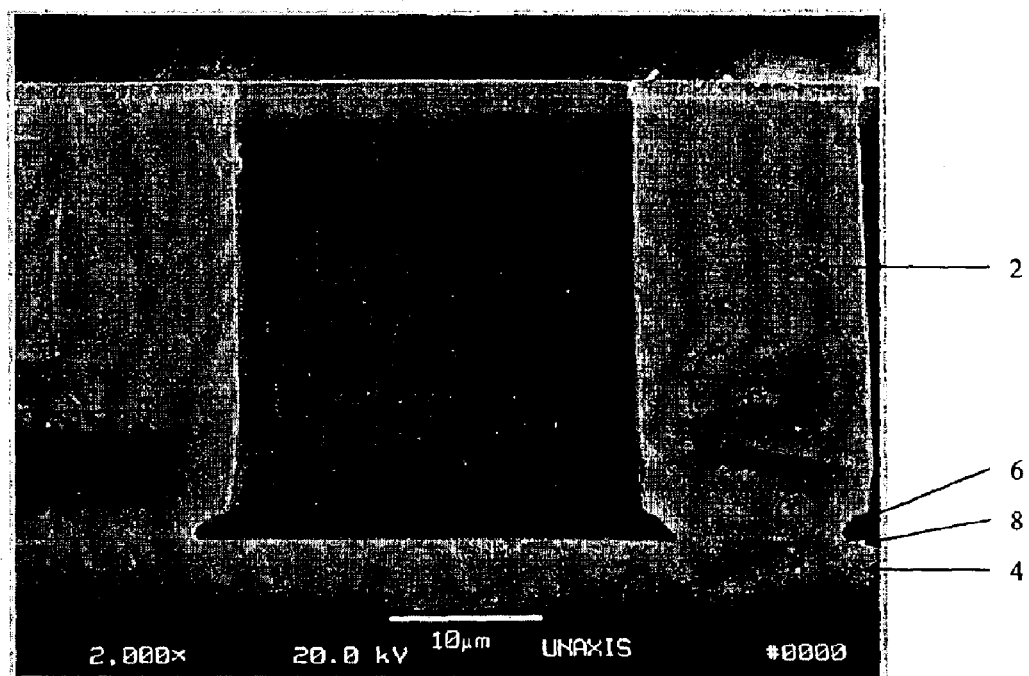
Figure 1  SOI feature etched using no pulsing (prior art)
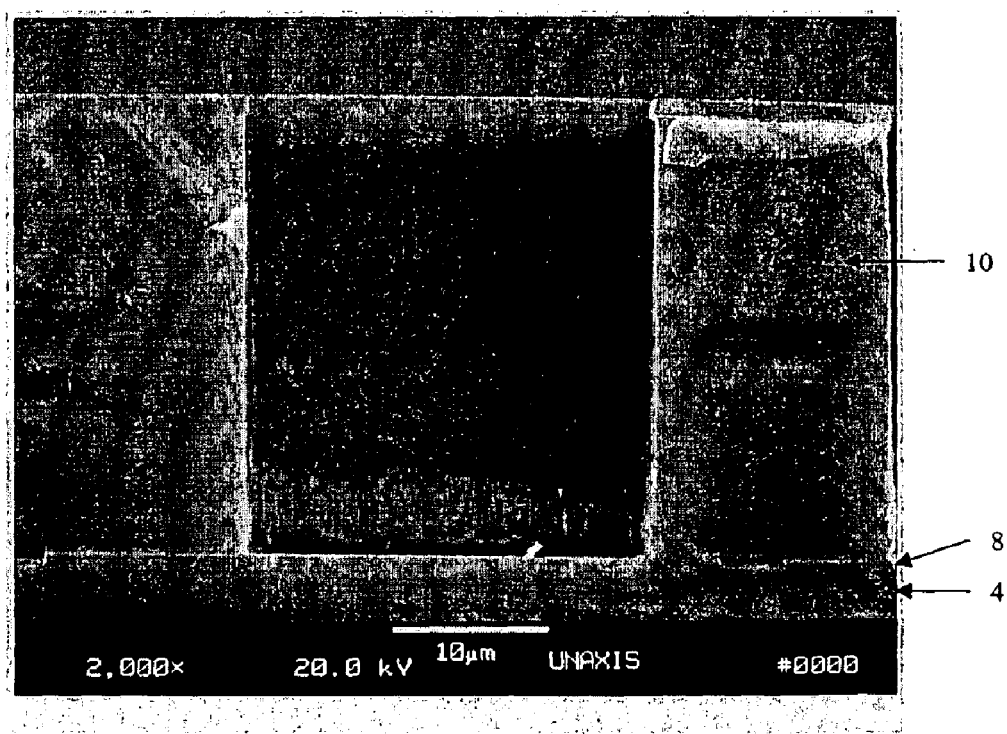
Figure 2  Same feature as Fig 1, using ICP pulsing

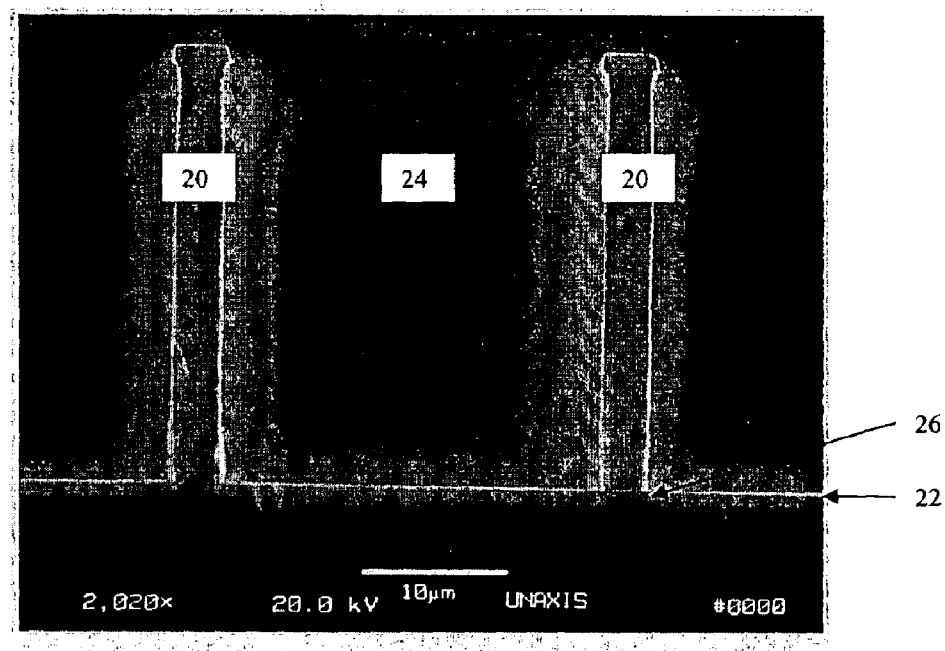
Figure 3 Narrow features etched in an SOI structure using ICP pulsing
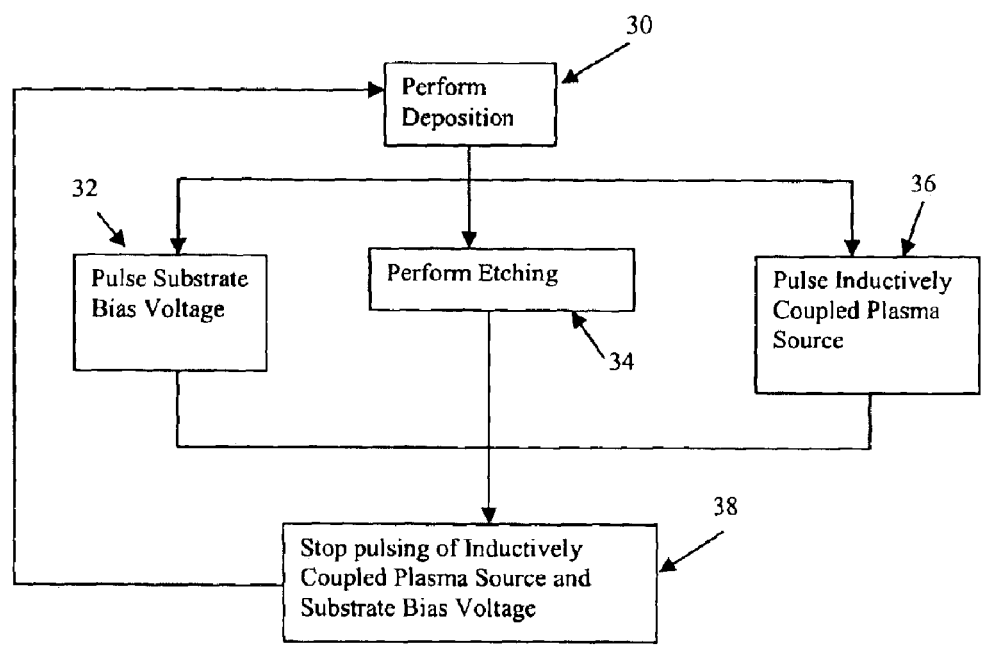
Fig. 4

NOTCH-FREE ETCHING OF HIGH ASPECT SOI STRUCTURES USING ALTERNATING DEPOSITION AND ETCHING AND PULSED PLASMA

CROSS REFERENCES TO RELATED APPLICATIONS

This application claims priority from and is related to commonly owned U.S. Provisional Patent Application Ser. No. 60/398,347 filed Jul. 24, 2002, entitled: Notch-Free Etching of High Aspect SOI Structures Using Alternating Deposition and Etching and Pulsed ICP, this Provisional Patent Application incorporated by reference herein.

FIELD OF THE INVENTION

The present invention relates generally to the manufacture of silicon based micro-electromechanical-systems. More particularly, the present invention relates to the manufacture of high aspect ratio silicon structures using alternating deposition and etching steps with a pulsed inductively coupled plasma (ICP) source.

BACKGROUND OF THE INVENTION

The fabrication of high aspect ratio features in silicon is used extensively in the manufacture of micro-electro-mechanical-systems (MEMS) devices. Such features frequently extend completely through the silicon wafer and may require etching in excess of 500 $\mu$m into the silicon substrate. Even "shallow" features require etch depths up to 30 $\mu$m with feature widths as small as 1 $\mu$m, requiring the definition of structures with aspect ratios (depth/width) in excess of 30:1. To ensure economically feasible manufacturability, these processes must operate at high etch rates to maintain reasonable throughputs.

Conventional, single step, plasma etch processes cannot simultaneously meet these needs, and, thus alternative deposition/etching processes have been developed. For example, the process disclosed in U.S. Pat. Nos. 4,985,114 and 5,501,893 use a high density plasma source, typically an Inductively Coupled Plasma (ICP), in conjunction with a radio frequency (RF) biased substrate electrode. Sulfur Hexafluoride ($SF_6$) is used as the etch gas and gases such as $CCl_4$ (U.S. Pat. No. 4,985,114) or $C_4F_8$ (U.S. Pat. No. 5,501,893) as the deposition gas. The process alternates with an interval of a few seconds between these two gases and results in silicon etch rates greater than 5 $\mu$m/min with high aspect ratios and deep etches into silicon substrates. It should be noted that other high density plasma sources such as Electron Cyclotron Resonance (ECR) or Helicon can be used.

Certain MEMS devices require that the silicon substrate be etched down to a buried insulating layer, such as a silicon dioxide ($SiO_2$) layer, which acts as an etch stop. This structure is known as a Silicon On Insulator (SOI) structure which is required for functionality of the final device. When such structures are etched using a method such as disclosed in the '114 or '893 patent, "notching" occurs, which is a common reference to a well-documented phenomenon. Notching is evidenced as a severe undercutting of the silicon, localized at the silicon/insulator interface. It is generally understood that notching is caused by electrical charging effects during etching. Such effects are not present during the bulk etch because the silicon substrate is sufficiently conductive to ensure that current flow within the substrate prevents any charge separation. When the etch reaches the interface, the insulator is exposed and the conductive current path is broken, which allows charge separation to occur. Because of the different angular distributions of ions and electrons in the plasma, ions (+ve charge) tend to accumulate at the bottom of the feature, and electrons (–ve charge) at the top. The resultant electric field is strong enough to bend the trajectories of arriving ions into the feature sidewall where lateral etching (notching) occurs. See K P Giapis, Fundamentals of Plasma Process-Induced Charging and Damage in *Handbook of Advanced Plasma Processing Techniques*, R J Shul and S J Pearton, Eds, Springer 2000.

The notching effect is more prevalent in high density plasmas, because the ion density, and therefore the charging effect due to the ions, is greater. The effect can be reduced by the use of a low density plasma, such as in conventional reactive ion etching (RIE), which is employed only after the insulator has been exposed. See Donohue et. al. U.S. Pat. No. 6,071,822. The major drawback of such an approach is the low etch rate attainable, which is a serious shortcoming when features with various depths must be etched. This is a necessary consequence of etching devices with various feature sizes, which will etch to different depths due to Aspect Ratio Dependent Etching (ARDE).

The use of low frequency substrate bias in conjunction with an alternating deposition/etch process has been described as a solution to the notching phenomena, see Hopkins et. al. U.S. Pat. No. 6,187,685. The same inventors also describe the use of a pulsed RF bias in conjunction with a high density etch process as an alternative means of reducing notching. Hopkins describes pulsing of the high density source (ICP) but concludes that this is ineffective in eliminating notching, and therefore teaches away from this approach as a possible solution.

U.S. Pat. Nos. 5,983,828, 6,253,704 and 6,395,641 by Savas teach the use of a pulsed ICP to alleviate surface charging and subsequent notching. More specifically, in the U.S. Pat. No. 5,983,828, Savas teaches pulsed ICP for eliminating notching, but limits the ICP operating powers to greater than 5 kW. In the U.S. Pat. Nos. 6,253,704 and 6,395,641, Savas teaches pulsed ICP in conjunction with pulsed RF biased power. However, none of the pulsed ICP disclosures by Savas describe or suggest the use of pulsed ICP to eliminate notching for multi-step processes consisting of alternating deposition and etching steps.

SUMMARY OF THE INVENTION

A preferred embodiment of the present invention is directed toward a method for anisotropically etching a substantially notch-free feature in a substrate. In accordance with this method, a substrate is subjected to an alternating cyclical process within a plasma chamber. The alternating cyclical process includes an etching step and a deposition step. An inductively coupled plasma source is pulsed during the etching step of the alternating cyclical process. Most preferably, the inductively coupled plasma source is pulsed when the substrate is etched and the insulating layer is exposed, and the inductively coupled plasma source is not pulsed when the substrate is etched and the insulating layer is not exposed. A bias voltage is provided to the substrate. The bias voltage may also be pulsed. The pulsing may be either in phase or out of phase with the pulsing of the inductively coupled plasma source. The bias voltage may be at an RF frequency or may be d.c.

Another embodiment of the present invention is directed toward a method of etching a feature in a silicon substrate provided on an insulating layer during a cyclical deposition/ etch process. The method includes etching the substrate with an inductively coupled plasma from an inductively coupled plasma source while pulsing the inductively coupled plasma source. The pulse width of an on state of the pulsed inductively coupled plasma source is selected such that charge build up does not reach a steady state. Typically, this condition is satisfied when a pulse width of an on state of the pulsed inductively coupled plasma source is less than a few milliseconds.

The above described embodiments of the present invention improve upon the prior art by reducing or eliminating notching at the junction of the substrate and the insulator. This is particularly beneficial when constructing high aspect ratio SOI structures where the notching that occurs may cause the structures to break loose from the substrate. Furthermore, the duration of the pulsing is selected such that the production time required to etch the substrate is not significantly increased. Therefore, the present invention represents a substantial improvement upon the prior art.

BRIEF DESCRIPTION OF THE DRAWINGS

FIG. 1 is a depiction of a substrate and the notching that may occur during prior art methods of etching and deposition;

FIG. 2 is a depiction of the same feature as FIG. 1 etched using a pulsed inductively coupled plasma source in accordance with an embodiment of the present invention;

FIG. 3 is a depiction of a substrate etched in accordance with a preferred embodiment of the present invention; and FIG. 4 is a flow chart of a method of etching a substrate in accordance with a preferred embodiment of the present invention.

DETAILED DESCRIPTION OF THE INVENTION

Preferred embodiments of the present invention are directed toward a method and apparatus for reducing, or eliminating the notching observed when etching SOI structures. This is preferably accomplished by using an alternating deposition/etch process in conjunction with an ICP source which is pulsed between on and off states.

Referring to FIG. 1., a feature 2 etched in a substrate 4 that has been deposited on an insulating layer 8 without pulsing the ICP source is shown. The feature 2 is the result of etching an SOI structure using the process of the '893 patent with an approximate 2 minute over-etch (sufficient to etch other smaller structures). In such a process, notches 6 form at the junction of the substrate 4 and the insulating layer 8. The notch 6 at the silicon-insulator interface is evident, and extends ~3 µm into the silicon. It can also be seen that the notches 6 undercut the feature 2 etched from the substrate 4. As the size of the feature to be constructed decreases, the undercutting caused by the notches 6 may severely damage the feature being constructed. More particularly, features with widths of ~4 µm were undercut so badly that many were no longer attached to the substrate. Thus, in extreme cases, the notching 6 of the substrate 4 may result in the failure of the device being constructed from the substrate 4. It should be understood that other deposition/etch processes using a high density source (e.g., as described in the '114 patent) show similar effects.

To minimize or prevent the notching shown in FIG. 1, preferred embodiments of the present invention pulse the inductively coupled plasma source. The ICP source is preferentially pulsed during the etch cycle of the deposition/etch process, since this is when the notching primarily occurs. However, the ICP can also be pulsed through both deposition and etch cycles. The pulse width of the ICP on state should be short enough that the charge build up does not reach a steady state, or is at a steady state for only a short period of time, and is of the order of a few microseconds to a few milliseconds. The ICP off state should be long enough that charge bleed off can occur, but not so long that reduced etch rates due to a low duty cycle result. The off time should also be of the order of a few microseconds to a few milliseconds. The pulse duty cycle should be in the range of 5–50%.

When the structure shown in FIG. 1 is etched using identical process conditions, except that the ICP is pulsed during the etch cycle (200 µs on, 200 µs off, 50% duty cycle) then the undercut at the silicon-insulator interface is dramatically reduced. This is shown in the cross section depicted in FIG. 2. The feature 10 etched in the substrate 4 of FIG. 2 using a pulsed ICP source has vastly reduced notches in the area of the junction between the substrate 4 and the insulating layer 8. This reduction in notching also dramatically reduces the risk that a narrow or deep feature will be undercut to an extent that the device being constructed will fail. The method used to produce the feature 10 of FIG. 2 can be implemented as a single step or multi-step process. In the single step implementation, pulsed ICP is used during the whole process. In the multi step implementation, the first step can be any suitable process resulting in the required etch profile and etch rate, but which is terminated before the underlying insulator is exposed. The ICP need only be pulsed for the period when the insulator film is exposed, since this is when the maximum benefit from charge reduction and notch reduction is expected. The etch is completed using a pulsed ICP "finish" etch to avoid notching at the silicon/insulator interface.

In accordance with an especially preferred embodiment, a substrate bias can be maintained "on" continuously during the etch cycle, or it to can be pulsed. This pulsing of the bias voltage can be either in phase with the ICP pulse (i.e., the bias voltage is pulsed on when the ICP is on) or can be out of phase with the ICP (i.e., the bias voltage is pulsed on when the ICP is off). In the latter mode, use is made of the ion-ion plasma that exists briefly after the ICP power has been turned off. The substrate bias pulsing can be at a preferred frequency of 13.56 MHz or it can be at higher frequencies (e.g., 27, 40, 60 or 100 MHz) or at lower frequencies (e.g., 50–500 kHz) or it can be d.c.

FIG. 3 depicts the results obtained by pulsing the ICP in connection with the construction of narrow or deep features 20. The narrow features 20 have widths of ~3 µm surrounded by relatively large etched areas 24. The narrow features 20 have been etched with little or no undercut in the previously notched areas 26 at the substrate and insulator 22 junction.

Referring now to FIG. 4, a cyclical method of constructing a feature on a substrate in accordance with an embodiment of the present invention is shown. The method commences in block 30 with the performing of a deposition process on the substrate. The method then proceeds to block 34 wherein an etching process is performed on the substrate. While the etching step 34 is being performed, an ICP source used during the etching is pulsed 36. As discussed above, pulsing the ICP source minimizes or eliminates notching that occurs at the silicon-insulator junction. In addition, a substrate bias voltage is pulsed in block 32 during the etching step 34 to further reduce any notching. After the etching has been performed, the method proceeds to block 38 wherein the pulsing of the bias voltage and the inductively coupled plasma source is stopped. The method then returns to block 30 wherein another deposition process is performed. The process is then repeated until the etching and deposition is finished.

It will be understood that the specific embodiments of the invention shown and described herein are exemplary only. Numerous variations, changes, substitutions and equivalents will now occur to those skilled in the art without departing from the spirit and scope of the present invention. Accordingly, it is intended that all subject matter described herein and shown in the accompanying drawings be regarded as illustrative only and not in a limiting sense and that the scope of the invention be solely determined by the appended claims.

What is claimed is:

1. A method for etching a feature in a substrate comprising the steps of:
   placing the substrate in a vacuum chamber;
   introducing at least one process gas into the vacuum chamber;
   generating a high density plasma using a high density plasma source;
   subjecting the substrate to a cyclic process having an etching step and a deposition step;
   applying a bias voltage in at least one step of the cyclic process to the substrate;
   pulsing the high density plasma source in at least one step of the cyclic process; thereby reducing notching on the substrate; and
   removing the substrate from the vacuum chamber.

2. The method of claim 1 wherein the bias voltage is D.C.

3. The method of claim 1 wherein the bias voltage is RF.

4. The method of claim 3 wherein the RF bias voltage frequency is less than about 500 kHz.

5. The method of claim 1 wherein the bias voltage is pulsed.

6. The method of claim 5 wherein the RF bias is pulsed in-phase with the pulsing of the high density plasma source.

7. The method of claim 5 wherein the RF bias is pulsed out of phase with the pulsing of the high density plasma source.

8. The method of claim 1 wherein the high density plasma source is an inductively coupled plasma source.

9. The method of claim 1 wherein the high density plasma source is pulsed during the etch step.

10. The method of claim 9 wherein the high density plasma source has a pulse duration of less than the time required for substrate charge to reach steady state.

11. The method of claim 1 wherein the pulsed high density plasma source has a pulse period of less than about 5 ms.

12. The method of claim 1 wherein the pulsed high density plasma source has a pulse period of about 200 $\mu$s.

13. The method of claim 1 wherein the pulsed high density plasma source has a duty cycle of less than about 50%.

14. The method of claim 1 wherein the pulsed high density plasma source has a duty cycle of about 10%.

15. The method of claim 1 wherein the substrate contains an insulating layer.

16. The method of claim 15 wherein the high density plasma source is pulsed when said insulating layer is exposed.

* * * * *